(12) United States Patent
Kozuka et al.

(10) Patent No.: US 9,436,042 B2
(45) Date of Patent: Sep. 6, 2016

(54) LIQUID CRYSTAL DISPLAY DEVICE INCLUDING FIRST TO THIRD WIRINGS AND A PIXEL ELECTRODE, AND METHOD OF MANUFACTURING THE SAME

(71) Applicant: Japan Display Inc., Tokyo (JP)

(72) Inventors: Tomoko Kozuka, Gunma-ken (JP); Hirokazu Morimoto, Saitama-ken (JP)

(73) Assignee: JAPAN DISPLAY INC., Tokyo (JP)

( * ) Notice: Subject to any disclaimer, the term of this patent is extended or adjusted under 35 U.S.C. 154(b) by 523 days.

(21) Appl. No.: 13/872,615

(22) Filed: Apr. 29, 2013

(65) Prior Publication Data

US 2013/0300992 A1 Nov. 14, 2013

(30) Foreign Application Priority Data

May 8, 2012 (JP) ................................. 2012-106969

(51) Int. Cl.
| | | |
|---|---|---|
| *G02F 1/1343* | (2006.01) | |
| *H01L 33/62* | (2010.01) | |
| *G02F 1/1362* | (2006.01) | |

(52) U.S. Cl.
CPC ....... *G02F 1/1343* (2013.01); *G02F 1/136286* (2013.01); *H01L 33/62* (2013.01); *G02F 1/136213* (2013.01); *G02F 2001/13629* (2013.01); *G02F 2001/136218* (2013.01); *G02F2001/136295* (2013.01); *G02F 2202/10* (2013.01); *H01L 2924/0002* (2013.01)

(58) Field of Classification Search
CPC .................. G02F 1/136286; G02F 1/136213; G02F 2001/136218; G02F 2001/13629; G02F 2001/136295; G02F 2202/10
See application file for complete search history.

(56) References Cited

U.S. PATENT DOCUMENTS

| | | | |
|---|---|---|---|
| 6,266,116 B1 | 7/2001 | Ohta et al. | |
| 7,259,807 B2* | 8/2007 | Kim | ....................... G02F 1/1333 257/797 |
| 7,551,259 B2* | 6/2009 | Park | ................... G02F 1/136213 349/140 |

(Continued)

FOREIGN PATENT DOCUMENTS

| | | |
|---|---|---|
| JP | 6-222397 | 8/1994 |
| JP | 7-159807 | 6/1995 |

(Continued)

OTHER PUBLICATIONS

Office Action issued Sep. 15, 2015 in Japanese Patent Application No. 2012-106969 (with English language translation).

*Primary Examiner* — Paisley L Arendt
(74) *Attorney, Agent, or Firm* — Oblon, McClelland, Maier & Neustadt, L.L.P.

(57) ABSTRACT

In a method of manufacturing a liquid crystal display device, a process for forming a first substrate includes the steps; forming a first wiring electrically connected with a switching element and extending in a first direction, forming an insulating film covering the first wiring, painting an electrically conductive film including electrically conductive material on the insulating film, and forming a second wiring electrically connected with the switching element extending in a second direction orthogonally crossing the first direction, and a pixel electrode electrically connected with the switching element apart from the second wiring by patterning the electrically conductive film. A second substrate is formed by forming a main common electrode extending in the second direction. A liquid crystal display panel is manufactured by holding liquid crystal material between the first substrate and the second substrate while the main common electrode faces the second wiring.

4 Claims, 10 Drawing Sheets

(56) References Cited

U.S. PATENT DOCUMENTS

| | | |
|---|---|---|
| 7,999,880 B2 * | 8/2011 | Chai ................ G02F 1/134309 349/122 |
| 2001/0010575 A1 | 8/2001 | Yoshida et al. |
| 2004/0165136 A1 | 8/2004 | Sugiyama et al. |
| 2005/0206824 A1 | 9/2005 | Son et al. |
| 2005/0219453 A1 | 10/2005 | Kubo et al. |
| 2007/0115234 A1 | 5/2007 | Kim et al. |
| 2008/0062358 A1 | 3/2008 | Lee et al. |
| 2008/0180590 A1 | 7/2008 | Lee et al. |
| 2008/0180623 A1 | 7/2008 | Lee et al. |
| 2008/0186439 A1 | 8/2008 | Kwon et al. |
| 2010/0101839 A1 | 4/2010 | Saran et al. |
| 2011/0234947 A1 * | 9/2011 | Hirosawa .......... G02F 1/134363 349/96 |

FOREIGN PATENT DOCUMENTS

| | | |
|---|---|---|
| JP | 9-160041 | 6/1997 |
| JP | 9-160042 | 6/1997 |
| JP | 9-160061 | 6/1997 |
| JP | 10-26765 | 1/1998 |
| JP | 10-90708 | 4/1998 |
| JP | 2000-81641 A | 3/2000 |
| JP | 2003-505720 A | 2/2003 |
| JP | 2003-258256 A | 9/2003 |
| JP | 2005-3802 | 1/2005 |
| JP | 3644653 | 2/2005 |
| JP | 2005-241923 A | 9/2005 |
| JP | 2005-242307 | 9/2005 |
| JP | 2009-128905 A | 6/2009 |
| JP | 2010-170123 A | 8/2010 |

\* cited by examiner

LIQUID CRYSTAL DISPLAY DEVICE INCLUDING FIRST TO THIRD WIRINGS AND A PIXEL ELECTRODE, AND METHOD OF MANUFACTURING THE SAME

CROSS-REFERENCE TO RELATED APPLICATION

This application is based upon and claims the benefit of priority from prior Japanese Patent Application No. 2012-106969 filed May 8, 2012, the entire contents of which are incorporated herein by reference.

FIELD

Embodiments described herein relate generally to a liquid crystal display device and a method of manufacturing the same.

BACKGROUND

In recent years, a flat panel display device is developed briskly. Especially, the liquid crystal display device gets a lot of attention from advantages, such as light weight, thin shape, and low power consumption. In an active matrix type liquid crystal display device equipped with a switching element in each pixel, structures using lateral electric field, such as IPS (In-Plane Switching) mode and FFS (Fringe Field Switching) mode, attract attention. The liquid crystal display device using the lateral electric field mode is equipped with pixel electrodes and a common electrode formed in an array substrate, respectively. Liquid crystal molecules are switched by the lateral electric field substantially in parallel with the principal surface of the array substrate.

On the other hand, another technique is also proposed, in which the liquid crystal molecules are switched using the lateral electric field or an oblique electrical field between the pixel electrode formed in the array substrate and the common electrode formed in a counter substrate.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION

Figure 1:
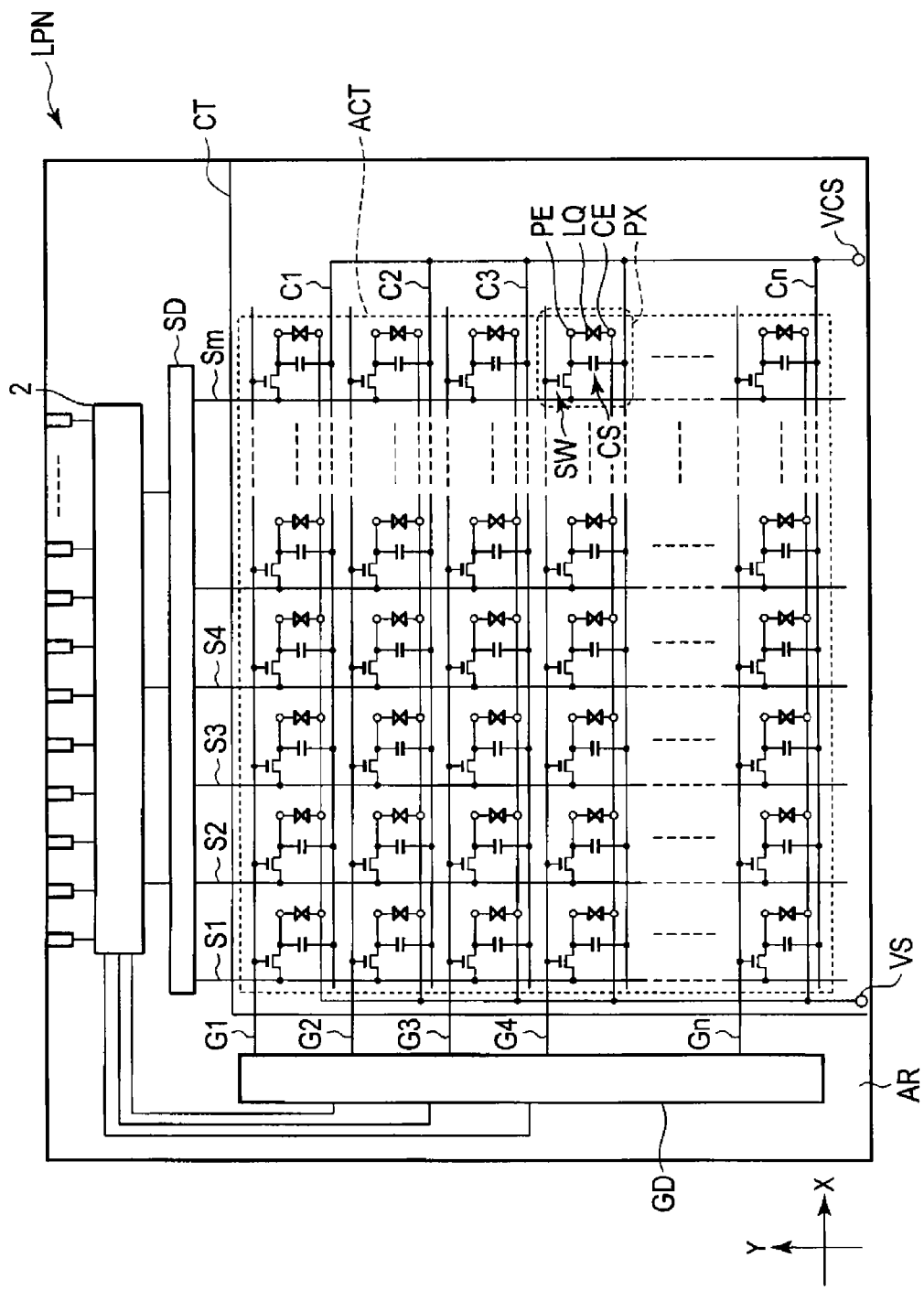
FIG. 1 is a figure schematically showing a structure and the equivalent circuit of a liquid crystal display device according to one embodiment.

A liquid crystal display device and a method of manufacturing the same according to an exemplary embodiment of the present invention will now be described with reference to the accompanying drawings wherein the same or like reference numerals designate the same or corresponding portions throughout the several views.

According to one embodiment, a method of manufacturing a liquid crystal display device includes the steps of: forming a first substrate including the steps; forming a first wiring electrically connected with a switching element and extending in a first direction, forming an insulating film covering the first wiring, painting an electrically conductive film including electrically conductive material on the insulating film, and forming a second wiring electrically connected with the switching element extending in a second direction orthogonally crossing the first direction, and a pixel electrode electrically connected with the switching element apart from the second wiring by patterning the electrically conductive film, forming a second substrate by forming a main common electrode extending in the second direction; and forming a liquid crystal display panel holding liquid crystal material between the first substrate and the second substrate while the main common electrode faces the second wiring.

According to other embodiment, a method of manufacturing a liquid crystal display device includes the steps of: forming a first substrate including the steps; forming a first wiring electrically connected with a switching element and extending in a first direction, forming a first insulating film covering the first wiring, forming a second wiring on the first insulating film electrically connected with the switching element, and extending in a second direction orthogonally crossing the first direction, forming a second insulating film covering the second wiring and the switching element, painting an electrically conductive film including electrically conductive material on the second insulating film, and forming a pixel electrode electrically connected with the switching element by patterning the electrically conductive film, forming a second substrate including a main common electrode extending in the second direction; and forming a liquid crystal display panel holding liquid crystal material between the first substrate and the second substrate while the main common electrode faces the second wiring.

According to other embodiment, a liquid crystal display device includes: a first substrate including; a first wiring extending in a first direction, an insulating film covering the first wiring, a second wiring formed on the insulating film and extending in a second direction orthogonally crossing the first direction, a switching element electrically connected with the first and second wirings, a pixel electrode formed on the insulating film and electrically connected with the switching element apart from the second wiring, and a first alignment film covering the second wiring and the pixel electrode, a second substrate including a main common electrode facing the second wiring and extending in the second direction, and a second alignment film covering the main common electrode; and a liquid crystal layer held between the first substrate and the second substrate containing liquid crystal molecules; wherein the second wiring and the pixel electrode are formed of one of materials selected from the group consisting of carbon nanotube, gold nanowire, silver nanowire, graphene, and electrically conductive polymers According to other embodiment, a liquid crystal display device includes: a first substrate including; a first wiring extending in a first direction, a first insulating film covering the first wiring, a second wiring formed on the first insulating film and extending in a second direction orthogonally crossing the first direction, a switching element electrically connected with the first and second wirings, a second insulating film covering the second wiring and the switching element, a pixel electrode formed on the second insulating film and electrically connected with the switching element, a first shield electrode formed on the second insulating film apart from the pixel electrode and facing the first wiring, a second shield electrode formed on the second insulating film apart from the pixel electrode and facing the second wiring, and a first alignment film covering the pixel electrode and the first and second shield electrodes, a second substrate including a main common electrode facing the second wiring and extending in the second direction, and a second alignment film covering the main common electrode; and a liquid crystal layer held between the first substrate and the second substrate containing liquid crystal molecules; wherein the pixel electrode, the first and second shield electrodes are formed of one of materials selected from the group consisting of carbon nanotube, gold nanowire, silver nanowire, graphene, and conductive polymers.

FIG. 1 is a figure schematically showing a structure and the equivalent circuit of the liquid crystal display device according to one embodiment.

The liquid crystal display device includes an active-matrix type liquid crystal display panel LPN. The liquid crystal display panel LPN is equipped with an array substrate AR as a first substrate, a counter substrates CT as a second substrate arranged opposing the array substrate AR, and a liquid crystal layer LQ held between the array substrate AR and the counter substrate CT. The liquid crystal display panel LPN includes an active area ACT which displays images. The active area ACT is constituted by a plurality of pixels PX arranged in the shape of a (m×n) matrix (here, "m" and "n" are positive integers).

The liquid crystal display panel LPN is equipped with "n" gate lines G (G1-Gn), "n" auxiliary capacitance lines C (C1-Cn), "m" source lines S (S1-Sm), etc., in the active area ACT. The gate line G and the auxiliary capacitance line C linearly extend in a first direction X, respectively. The gate line G and the auxiliary capacitance line C are arranged in turns along a second direction Y that orthogonally intersects the first direction X apart from each other. The source lines S cross the gate line G and the capacitance line C. The source lines S extend linearly in the second direction Y, respectively. The gate line G, the auxiliary capacitance line C and the source lines S do not necessarily extend linearly, and a portion thereof may be crooked partially.

Each gate line G is pulled out to the outside of the active area ACT and connected to a gate driver GD. Each source line S is pulled out to the outside of the active area ACT and connected to a source driver SD. At least a portion of the gate driver GD and the source driver SD is formed in the array substrate AR, for example, and connected with the driver IC chip 2 provided in the array substrate AR and having an implemented controller.

Each pixel PX includes a switching element SW, a pixel electrode PE, a common electrode CE, etc. Retention capacitance Cs is formed, for example, between the auxiliary capacitance line C and the pixel electrode PE. The auxiliary capacitance line C is electrically connected with a voltage impressing portion VCS to which an auxiliary capacitance voltage is impressed.

In addition, in the liquid crystal display panel LPN according to this embodiment, while the pixel electrode PE is formed in the array substrate AR, at least a portion of the common electrode CE is formed in the counter substrate CT. Liquid crystal molecules of the liquid crystal layer LQ are switched mainly using an electric field formed between the pixel electrode PE and the common electrode CE. The electric field formed between the pixel electrode PE and the common electrode CE is lateral electric field substantially in parallel with the principal surface of the array substrate AR or the counter substrate CT, or an oblique electric field slightly oblique with respect to the principle surfaces of the substrates.

The switching element SW is constituted by an n channel type thin film transistor (TFT), for example. The switching element SW is electrically connected with the gate line G and the source line S. The switching element SW may be either a top-gated type or a bottom-gated type. Though the semiconductor layer is formed of poly-silicon, the semiconductor layer may be formed of amorphous silicon.

The pixel electrode PE is arranged in each pixel PX and electrically connected with the switching element SW. The common electrode CE of common potential is arranged in common to the plurality of pixel electrodes PE through the liquid crystal layer LQ.

As one example, the pixel electrode PE is formed of a film including at least one of materials selected from the group consisting of carbon nanotube, gold nanowire, silver nanowire, graphene, and conductive polymers (polyacetylene, polythiophene, etc.). Moreover, although the common electrode CE may be formed of the same material as the pixel electrode PE, the common electrode CE may be formed of light transmissive conductive materials such as Indium Tin Oxide (ITO), Indium Zinc Oxide (IZO), etc.

The array substrate AR includes an electric power supply portion VS formed outside of the active area ACT for impressing a voltage to the common electrode CE. Furthermore, the common electrode CE is drawn to outside of the active area ACT and electrically connected with an electrically power supply portion VS formed in the array substrate AR through an electrically conductive component which is not illustrated.

FIG. 2A is a plan view schematically showing the structure of one pixel when the liquid crystal display panel according to a first embodiment is seen from the counter substrate side. Herein, a plan view in a X-Y plane specified in the first direction X and the second direction Y is shown.

The array substrate AR includes a gate line G1, a gate line G2, an auxiliary capacitance line C1, a source line S1, a source line S2, a switching element SW, a pixel electrode CE, a first alignment film AL1. Though the array substrate AR includes a first shield electrode SL1 and a second shield electrode SL2, they are not necessarily needed, and either one of the shield electrodes may be equipped.

The gate line G1, the gate line G2, and the auxiliary capacitance line C1 extend along the first direction X, respectively. The source line S1 and source line S2 extend along the second direction Y, respectively. The auxiliary capacitance line C1 is located substantially in the middle between the gate line G1 and the gate line G2. That is, the distance between the gate line G1 and the auxiliary capacitance line C1 in the second direction Y is substantially the same as the distance between the gate line G2 and the auxiliary capacitance line C1 in the second direction Y.

In this embodiment, the pixel PX corresponds to a square formed of the gate line G1, the gate line G2, the source line S1, and the source line S2 and has a shape of a rectangle whose length in the second direction Y is longer than the distance in the first direction X, as shown by a dashed line in the figure. The length of the pixel PX in the first direction X corresponds to a pitch in the first direction X between the source line S1 and the source line S2, and the length in the second direction Y of the pixel PX corresponds to the pitch in the second direction Y between the gate line G1 and the gate line G2. The pixel electrode PE is arranged between adjoining source line S1 and source line S2. Moreover, the pixel electrode PE is located between the gate line G1 and the gate line G2.

In this embodiment, the source line S1 is arranged at the left-hand side end in the pixel PX. Precisely, the source line S1 is arranged striding over a boundary between the illustrated pixel and a pixel PX adjoining the illustrated pixel PX on the left-hand side. The source line S2 is arranged at the right-hand side end. Precisely, the source line S2 is arranged striding over a boundary between the illustrated pixel and a pixel PX adjoining the illustrated pixel PX on the right-hand side. Moreover, in the pixel PX, the gate line G1 is arranged at an upper end portion. Precisely, the gate line G1 is arranged striding over a boundary between the illustrated pixel and a pixel which adjoins the illustrated pixel PX on its upper end side. The gate line G2 is arranged at a lower end portion. Precisely, the gate line G2 is arranged striding over a boundary between the illustrated pixel and a pixel which adjoins the illustrated pixel PX on its lower end side. The auxiliary capacitance line C1 is arranged approximately in a central portion of the pixel PX.

The switching element SW is electrically connected with the gate line G1 and the source line S1 in the illustrated example. Namely, the switching element SW is formed in an intersection of the gate line G1 with the source line S1. A drain line extends along the source line S1 and the auxiliary capacitance line C1, and is electrically connected with the pixel electrode PE through a contact hole formed in a region which overlaps with the auxiliary capacitance line C1. The switching element SW is arranged in an overlapped region with the source line S1 and the auxiliary capacitance line C1. The switching element SW hardly runs off the overlapped region. Thereby, reduction of the area of an aperture which contributes to a display is suppressed when the switching element SW is formed in the pixel PX.

The pixel electrode PE is equipped with a main pixel electrode PA and a sub-pixel electrodes PB. The main pixel electrodes PA and the sub-pixel electrode PB are formed integrally or continuously, and electrically connected mutually. In addition, although only the pixel electrode PE in a cross shape arranged in one PX is illustrated in the figure, the pixel electrode of the same form is arranged in other pixels which are not illustrated.

The main pixel electrode PA extends to an upper end and a lower end of the pixel PX along the second direction Y, and is formed in a shape of a belt having a predetermined width along the first direction X. The main pixel electrode PA is located approximately in the center between the source line S1 and the source line S2. That is, the distance between the source line S1 and the main pixel electrode PA in the first direction X is substantially the same as the distance between the source line S2 and the main pixel electrode PA in the first direction X.

Moreover, in this embodiment, the sub-pixel electrode PB is formed in the shape of a belt extending in the first direction X with a predetermined width. The sub-pixel electrode PB extends along the first direction X toward the left hand end and the right hand end of the pixel PX. The sub-pixel electrode PB crosses the main pixel electrode PA in an intermediate portion thereof in the second direction Y. That is, the pixel electrode PE is formed in a cross shape. Further, the sub-pixel electrode PB is located on the auxiliary capacitance line C1. The whole sub-pixel electrode PB is located in a region which overlaps with the auxiliary capacitance line C1. The sub-pixel electrode PB is electrically connected with the switching element SW.

The first shield electrode SL1 and the second shield electrode SL2 are apart from the pixel electrode PE, respectively. The first shield electrode SL1 extends along the first direction X, and counters with the gate line G1 and the gate line G2, respectively. The second shield electrode SL2 extends along the second direction Y, and counters with the source line S1 and the source line S2, respectively. The first shield electrode SL1 and the second shield electrode SL2 are integrally or continuously formed, and electrically connected mutually. That is, the first shield electrode SL1 and the second shield electrode SL2 are formed in the shape of a lattice. Moreover, the pixel electrode PE is arranged inside the lattice formed of the first shield electrode SL1 and the second shield electrode SL2.

The common electrode CE is equipped with a main common electrode CA. The main common electrodes CA linearly extend along the second direction Y in parallel to the main pixel electrode PA on both sides which sandwich the main pixel electrode PA in the X-Y plane. The main common electrode CA is arranged so as to face the source line S and the second shield electrode SL2. The main common electrode CA is formed in the shape of a belt having the same width in the first direction X. Though not illustrated, the common electrode CE may be equipped with a sub-common electrode extending in the first direction, and formed in a lattice shape. The common electrode is arranged facing the gate line G and the first shield electrode SL1.

In this embodiment, the main common electrode CA is arranged in two lines along the first direction X. Hereinafter, in order to distinguish the two lines, the main common electrode CA on the left-hand side in the figure is called CAL, and the main common electrode on the right-hand side in the figure is called CAR. Precisely, the main common electrode CAL is arranged striding over a boundary between the illustrated pixel and a pixel which adjoins the illustrated pixel PX on the left-hand side. The main common electrode CAR is arranged at the right-hand side end. Precisely, the main common electrode CAR is arranged striding over a boundary between the illustrated pixel and a pixel which adjoins the illustrated pixel PX on the right-hand side. The main common electrode CAL counters with the source line S1 (second shield electrode SL2 facing the source line S1), and the main common electrode CAR counters with the source line S2 (second shield electrode SL2 facing the source line S2). The main common electrode CAL and the main common electrode CAR are electrically connected in the active area or outside of the active area. In addition, the first shield electrode SL1 and the second shield electrode SL2 are electrically connected mutually and set to the same potential as the common electrode CE.

If its attention is paid to the positional relationship between the pixel electrode PE and the common electrode CA in the X-Y plane, the main pixel electrode PE and the main common electrode CA are arranged by turns along the first direction X. The main pixel electrode PA and the main common electrode CA are arranged in parallel each other. In this case, any main common electrodes CA do not overlap with the pixel electrode PE. A transmissive region is formed between the pixel electrode PE and the common electrode CA.

The distance between the pixel electrode PE and the common electrode CE is substantially constant along the first direction X. The main pixel electrode PA is arranged between the adjoining main common electrode CAL and the main common electrode CAR. The main pixel electrode PA is located substantially in the center between main common electrode CAL and main common electrode CAR. Namely, the distances between the main common electrode CAL and the main pixel electrode PA, and between the main common electrode CAR and the main pixel electrode PA are substantially the same in the first direction X.

Figure 2:
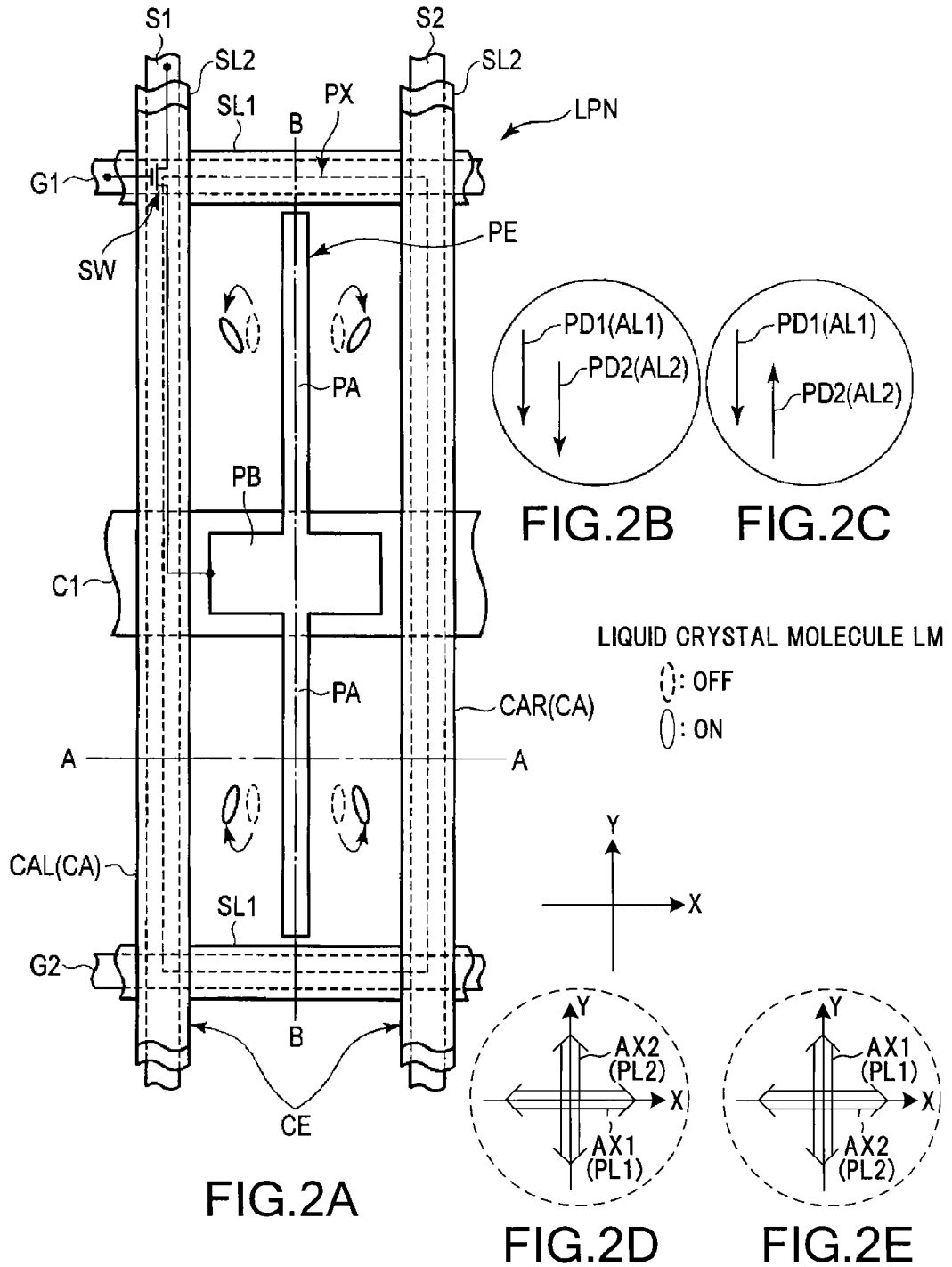
FIG. 2A is a plan view schematically showing a structure of one pixel when a display panel shown in FIG. 1 is seen from a counter substrate side according to a first embodiment.
FIGS. 2B and 2C are views showing alignment treatment directions.
FIGS. 2D and 2E are views showing polarizing axis directions of polarization plates.
Figure 3:
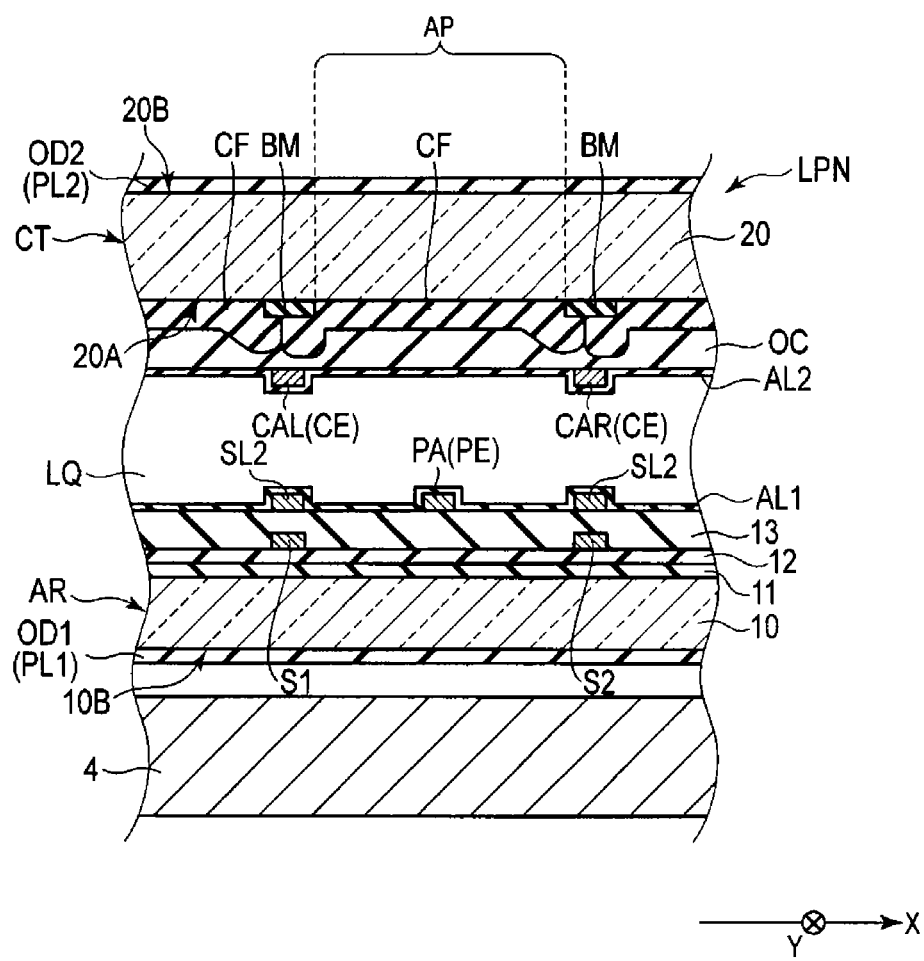
FIG. 3 is a cross-sectional view schematically showing the structure of the liquid crystal display panel taken along line A-A shown in FIG. 2A.
Figure 4:
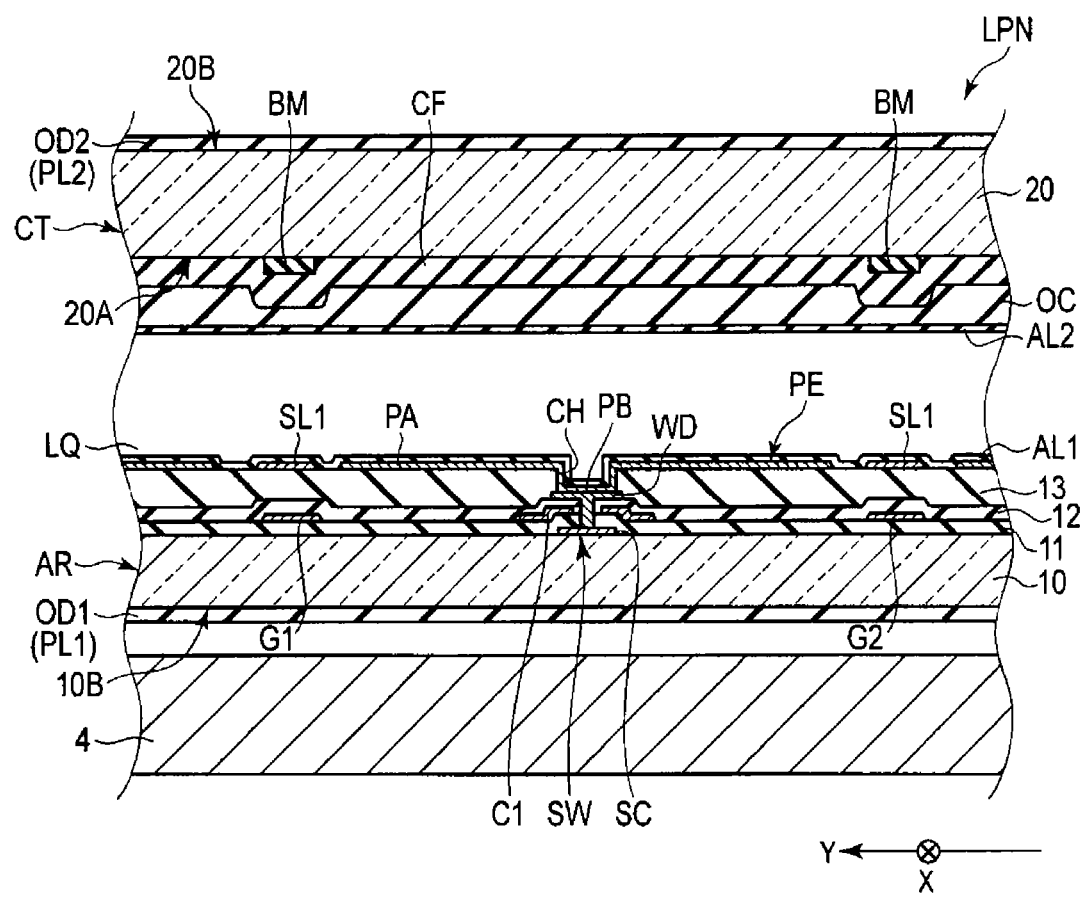
FIG. 4 is a cross-sectional view schematically showing the structure of the liquid crystal display panel taken along line B-B shown in FIG. 2A.

FIG. 3 is a cross-sectional view schematically showing the structure of the liquid crystal display panel taken along line A-A shown in FIG. 2A. FIG. 4 is a cross-sectional view schematically showing the structure of the liquid crystal display panel taken along line B-B shown in FIG. 2A. In addition, only the portion required for explanation is illustrated here.

A backlight 4 is arranged on the back side of the array substrate AR in the illustrated example. Various types of backlights can be used. For example, a light emitting diode (LED) and a cold cathode fluorescent lamp (CCFL), etc., can be applied as a light source of the backlight 4, and the explanation about its detailed structure is omitted.

The array substrate AR is formed using the first insulating substrate 10 which has a light transmissive characteristics. The array substrate AR is equipped with the source line S1, the source line S2, and the main pixel electrode PE including the main pixel electrode PA, a first insulating film 11, a second insulating film 12, a third insulating film 13, a first alignment film AL1, etc., on the inner side of the first insulating substrate 10.

A semiconductor layer SC of the switching element SW is formed in the inside surface 10A of the first insulating substrate 10 and covered with a first insulating film 11. The gate line G1, the gate line G2, and the auxiliary capacitance line C1 are formed on the first insulating film 11 and covered with the second insulating film 12. The source line S1 and the source line S2 are formed on the second insulating film 12 and covered with the third insulating film 13. That is, the second insulating film 12 corresponds to an interlayer insulating film between the gate line G1, the gate line G2 and the auxiliary capacitance line C1, and the source lines S1 and S2. The drain electrode WD of the switching element SW is formed on the second insulating film 12 in contact with the semiconductor layer SC and covered with the third insulating film 13. A contact hole CH penetrating to the drain electrode WD is formed in the third insulating film 13. The third insulating film 13 is formed of a transparent resin material, for example, and smoothes unevenness of the surface.

The pixel electrode PE equipped with the main pixel electrode PA and the sub-pixel electrode PB is formed on the third insulating film 13. The main pixel electrode PA is located inside of the pixel PX rather than the positions right above the source line S1 and the source line S2. The sub-pixel electrode PB is in contact with the drain electrode WD through the contact hole CH formed in the third insulating film 13.

The first shield electrode SL1 and the second shield electrode SL2 are formed on the third insulating film 13. The first shield electrode SL1 counters with the gate line G1 and the gate line G2. The second shield electrode SL2 counters with the source line S1 and the source line S2. The first shield electrode SL1 and the second shield electrode SL2 can be formed by the same material as the pixel electrode PE.

The first alignment film AL1 is arranged on the array substrate AR facing the counter substrate CT, and extends to whole active area ACT. The first alignment film AL1 covers the pixel electrode PE, the first shield electrode SL1, the second shield electrode SL2, etc., and is also arranged on the third insulating film 13. The first alignment film AL1 is formed of material which shows a horizontal alignment characteristics.

The counter substrate CT is formed using a second insulating substrate 20 which has a transmissive characteristics. The counter substrate CT includes a black matrix BM, a color filter CF, an overcoat layer OC, the common electrode CE including the main common electrodes CAL and CAR, and a second alignment film AL2, etc., facing the array substrate AR.

The black matrix BM forms an aperture AP facing the pixel electrode PE by defining each pixel PX. That is, the black matrix BM is arranged so that line portions, such as the source line S, the gate line G, the auxiliary capacitance line C1, and the switching element SW, may counter the black matrix BM. Herein, though only a portion of the black matrix BM extending along the second direction Y is shown, the black matrix BM may include a portion extending along the first direction X. The black matrix BM is formed on an internal surface 20A of the second insulating substrate 20 facing the array substrate AR.

The color filter CF is arranged corresponding to each pixel PX. That is, while the color filter CF is arranged in the aperture portion AP in the internal surface 20A of the second insulating substrate 20, a portion thereof runs on the black matrix BM. The colors of the color filters CF arranged in the adjoining pixels PX in the first direction X differ mutually. For example, the color filters CF are formed of resin materials colored by three primary colors of red, blue, and green, respectively. The red color filter formed of resin material colored in red is arranged corresponding to the red pixel. The blue color filter formed of resin material colored in blue is arranged corresponding to the blue pixel. The green color filter formed of resin material colored in green is arranged corresponding to the green pixel. The boundary between the adjoining color filters CF is located in a position which overlaps with the black matrix BM. The overcoat layer OC covers the color filter CF.

The overcoat layer OC covers the color filter CF. The overcoat layer OC eases influence by unevenness of the surface of the color filter CF. For example, the overcoat layer OC is formed of a transparent resin.

The main common electrode CAL and the main common electrode CAR of the common electrode CE are formed on the overcoat layer OC facing the array substrate AR. The main common electrode CAL is located above the source line S1 (above the second shield electrode SL2), and under the black matrix BM. The main common electrode CAR is located above the source line S2 (above the second shield electrode SL2), and under the black matrix BM. The width of the main common electrode CAL and the main common electrode CAR in the first direction X is substantially the same as the width of the black matrix BM located thereon. In the aperture AP, the region between the main common electrodes CAL and CAR, and the main pixel electrode PA corresponds to the transmissive region in which light can penetrate.

The second alignment film L2 is arranged on the counter substrate CT facing the array substrate AR and extends to whole active area ACT. The second alignment film L2 covers the main common electrode CAL, the main common electrode CAR, the overcoat layer OC, etc. The second alignment film L2 is formed of the material which shows horizontal alignment characteristics.

An alignment treatment (for example, rubbing processing or light alignment processing) is performed to the first alignment film AL1 and the second alignment film AL2 to initially align the molecules of the liquid crystal layer LQ. A first alignment treatment direction PD1 in which the first alignment film AL1 initially aligns the molecules is in parallel with a second alignment treatment direction PD2 in which the second alignment film AL2 initially aligns the molecules. For example, in FIG. 2B, the first alignment treatment direction PD1 and the second alignment treatment direction PD2 are in parallel with the second direction Y and the same directions each other. In FIG. 2C, the first alignment treatment direction PD1 and the second alignment treatment direction PD2 are in parallel with the second direction Y and opposite directions each other.

The array substrate AR and the counter substrate CT as mentioned-above are arranged so that the first alignment film AL1 and the second alignment film AL2 face each other. In this case, a pillar-shaped spacer is formed integrally with one of the substrates by resin material between the first alignment film AL1 on the array substrate AR and the second alignment film AL2 on the counter substrate CT. Thereby, a predetermined gap, for example, a 2-7 µm cell gap is formed. The array substrate AR and the counter substrate CT are pasted together by seal material arranged outside the active area ACT while the predetermined cell gap is formed.

The liquid crystal layer LQ is held in the cell gap formed between the array substrate AR and the counter substrate CT and arranged between the first alignment film AL1 and the second alignment film AL2. The liquid crystal layer LQ contains liquid crystal molecules. The liquid crystal layer LQ is constituted by liquid crystal material having positive dielectric anisotropy (positive type).

A first optical element OD1 is attached on an external surface 10B of the array substrate AR, i.e., the external surface 10B of the first insulating substrate 10 which constitutes the array substrate AR, by adhesives, etc. The first optical element OD1 is located on a side which counters with the backlight 4 of the liquid crystal display panel LPN, and controls the polarization state of the incident light which enters into the liquid crystal display panel LPN from the backlight 4. The first optical element OD1 includes a first polarization plate PL1 having a first polarizing axis (or first absorption axis) AX1. In addition, other optical elements such as a retardation film may be arranged between the first polarization plate PL1 and the first insulating substrate 10.

A second optical element OD2 is attached on an external surface of the counter substrate CT, i.e., the external surface 20B of the second insulating substrate 20 which constitutes the counter substrate CT by adhesives, etc. The second optical element OD2 is located on a display surface side of the liquid crystal display panel LPN, and controls the polarization state of emitted light from the liquid crystal display panel LPN. The second optical element OD2 includes a second polarization plate PL2 having a second polarizing axis (or second absorption axis) AX2. In addition, other optical elements such as the retardation film may be arranged between the second polarization plate PL2 and the second insulating substrate 20.

The first polarizing axis AX1 of the first polarization plate PL1 and the second polarizing axis AX2 of the second polarization plate PL2 are arranged in the positional relationship of Cross Nicol. In this state, one polarization plate is arranged so that the polarizing axis becomes in parallel with or orthogonally crosses the extending direction of the main pixel electrode PA and the main common electrode CA. That is, when the extending direction of the main pixel electrode PA and the main common electrode CA is the second direction Y, the polarizing axis of the one polarization plate is substantially in parallel with the second direction Y or orthogonally crosses the second direction Y.

In FIG. 2D, the first polarization plate PL1 is arranged so that the first polarizing axis AX1 orthogonally crosses the second direction Y, and the second polarization plate PL2 is arranged so that the second polarizing axis AX2 becomes in parallel with the second direction Y. In FIG. 2E, the second polarization plate PL2 is arranged so that the second polarizing axis AX2 orthogonally crosses the second direction Y, and the first polarization plate PL1 is arranged so that the first polarizing axis AX1 becomes in parallel with the second direction Y.

The operation of the liquid crystal display panel LPN of the above-mentioned structure is explained referring to FIGS. 2A, 2B, 2C, 2D, 2E, 3 and 4.

At the time of non-electric field state (OFF), i.e., when a potential difference (i.e., electric field) is not formed between the pixel electrode PE and the common electrode CE, the liquid crystal molecules LM of the liquid crystal layer LQ are aligned so that their long axes are aligned in a parallel direction with the first alignment direction PD1 of the first alignment film AL1 and the second alignment direction PD2 of the second alignment film AL2 as shown with a dashed line in the figure. In this state, the time of OFF corresponds to the initial alignment state, and the alignment direction of the liquid crystal molecule LM corresponds to the initial alignment direction.

In addition, precisely, the liquid crystal molecules LM are not exclusively aligned in parallel with the X-Y plane, but are pre-tilted in many cases. For this reason, the precise direction of the initial alignment is a direction in which an orthogonal projection of the alignment direction of the liquid crystal molecule LM at the time of OFF is carried out to the X-Y plane. However, in order to explain simply hereinafter, the liquid crystal molecule LM is assumed that the liquid crystal molecule LM is aligned in parallel with the X-Y plane, and is explained as what rotates in a field in parallel with the X-Y plane.

Here, both of the first alignment treatment direction PD1 of the first alignment film AL1 and the second alignment treatment direction PD2 of the second alignment film AL2 are directions in parallel to the second direction Y. At the time of OFF, the long axis of the liquid crystal molecule LM is aligned substantially in parallel to the second direction Y as shown with the dashed line in FIG. 2A. That is, the direction of the initial alignment of the liquid crystal molecule LM is in parallel to the second direction Y.

When the respective first alignment treatment direction PD1 and second alignment treatment direction PD2 are in parallel and the same directions each other as shown in the figure, the liquid crystal molecule LM is aligned with an approximately horizontal direction (i.e., the pre tilt angle is approximately zero) in a cross-section of the liquid crystal layer LQ in the intermediate portion of the liquid crystal layer LQ. The liquid crystal molecule LM is aligned with the pre-tilt angle so that the alignment of the liquid crystal molecule LM near the first alignment film AL1 and the second alignment film AL2 becomes symmetrical with respect to the intermediate portion of the liquid crystal layer LQ (splay alignment). Thus, in the splay alignment state, the display is optically compensated even in an inclining direction from a normal line of the substrate by the liquid crystal molecules LM near the first alignment film AL1 and the second alignment film AL2. Therefore, when the respective first alignment treatment direction PD1 and second alignment treatment direction PD2 are in parallel and the same directions each other, there are few optical leaks in a black display. Accordingly, a high contrast ratio can be realized, and it becomes possible to improve display grace.

In addition, when both of the first and second alignment treatment directions PD1 and PD2 are in parallel and opposite directions each other, the liquid crystal molecule LM is aligned so that the liquid crystal molecule LM is aligned with an approximately uniform pre-tilt angle near the first and second alignment films AL1 and AL2 and in the intermediate portion of the liquid crystal layer LQ (homogeneous alignment).

A portion of the backlight from the backlight 4 penetrates the first polarizing plate PL1, and enters into the liquid crystal display panel LPN. The entered light to the liquid crystal display panel LPN is lineally polarized light orthogonally crossing the first polarizing axis AX1 of the first polarization plate PL1. The lineally polarized state of the entered light does not change with the alignment state of the liquid crystal molecule LM when the light passes the liquid crystal layer LQ at the time OFF. Therefore, the lineally polarized light which penetrates the liquid crystal display panel LPN is absorbed by the second polarization plate PL2 arranged in a Cross Nicol positional relation (black display).

On the other hand, in case potential difference (or electric field) is formed between the pixel electrode PE and the common electrode CE, i.e., at the time of ON, the lateral electric field (or oblique electric field) is formed in parallel with the substrates between the pixel electrode PE and the common electrode CE. The liquid crystal molecule LM is affected by the electric field between the pixel electrode PE and the common electrode CE, and the long axis rotates in parallel with the X-Y plane as shown in a solid line in the figure.

In the embodiment shown in FIG. 2A, in the region between the pixel electrode PE and the main common electrode CAL, the liquid crystal molecule LM in the lower half region rotates clockwise to the second direction Y, and aligns so that it may turn to the lower left in the figure. The liquid crystal molecule LM in the upper half region rotates counterclockwise to the second direction Y, and aligns so that it may turn to the upper left in the figure. On the other hand, in the region between the main pixel electrode PA and the main common electrode CAR, the liquid crystal molecule LM in the lower half region rotates counterclockwise to the second direction Y, and aligns so that it may turn to the lower right in the figure. The liquid crystal molecule LM in the upper half region rotates clockwise to the second direction Y, and aligns so that it may turn to the upper right in the figure.

Thus, in each pixel PX, in case electric field is formed between the pixel electrode PE and the common electrode CE, the alignment direction of the liquid crystal molecule LM is divided into a plurality of directions by the position which overlaps with the pixel electrode PE and the common electrode CE, and domains are formed in each alignment direction. That is, a plurality of domains is formed in one pixel PX.

At the time of ON, a portion of the backlight which entered in the liquid crystal panel LPN from the back light 4 penetrates the first polarization plate PL1. The backlight which entered in the liquid crystal panel LPN is a linearly polarized light orthogonally crossing the first polarizing axis AX1 of the first polarization plate PL1. The polarization state of the linearly polarized light changes in accordance with the alignment state of the liquid crystal molecule LM when passing the liquid crystal layer LQ. At the time of ON, at least a portion of the backlight which passes the liquid crystal layer LQ penetrates the second polarization plate PL2 (white display).

Next, the method of manufacturing the liquid crystal display panel LPN mentioned above is explained.

Figure 5:
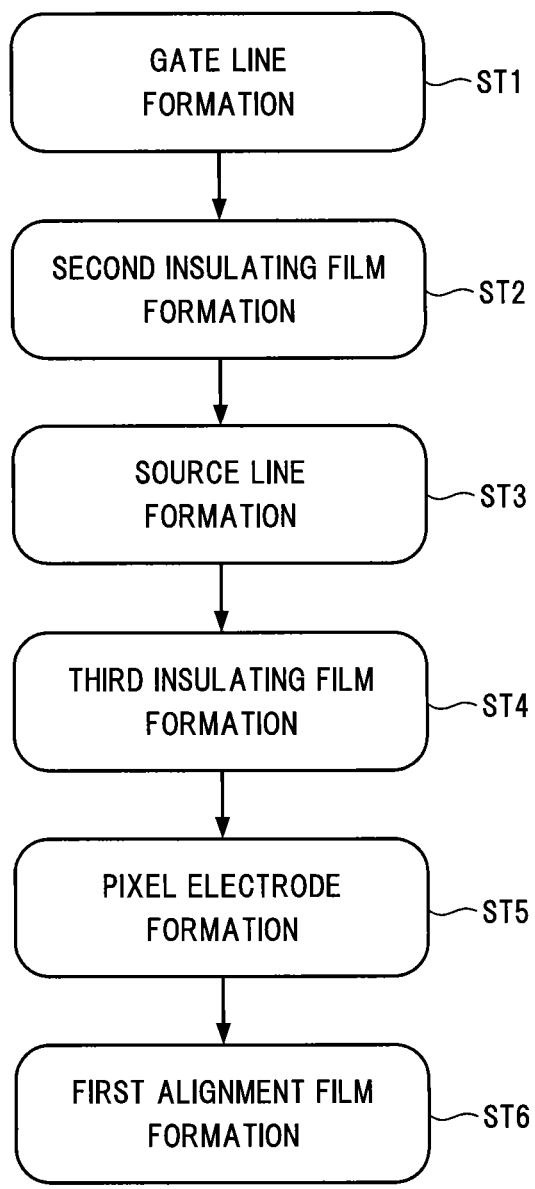
FIG. 5 is a flow-chart showing a process for manufacturing an array substrate.

FIG. 5 is a flow-chart showing a process for manufacturing the array substrate AR.

First, after forming the semiconductor layer SC and the first insulating film 11 on the first insulating substrate 10, the gate line G integrally formed with the gate electrode of the switching element SW and the auxiliary capacitance line C apart from the gate line G (ST1). Then, the second insulating film 12 which covers the gate line G, etc., are formed (ST2). After that, the source line S integrally formed with the source electrode of the switching element SW and the drain electrode of the switching element SW are formed on the second insulating film 12 (ST3). Then, the third insulating film 13 which covers the source line S, etc., is formed (ST4).

Then, the pixel electrode PE is formed on the third insulating film 13 (ST5). Here, the pixel electrode PE is formed by painting and patterning an electrically conductive film including electrically conductive material. The electrically conductive film further includes organic solvent and binder such as silicate. The electrically conductive material is one of the materials selected from the group consisting of carbon nanotube, gold nanowire, silver nanowire, graphene, and conductive polymers (polyacetylene, polythiophene, etc.). In particular, the electrically conductive material that can be formed into the electrically conductive film by a film forming method other than a vacuum film forming method is chosen as the material suitable for the electrically conductive material. As the technique of the painting, such as a spin coat technique, an ink-jet technique, a printing technique, and a transfer technique, are applicable. When the electrically conductive film including the electrically conductive material is painted on substantially all over the surface of the third insulating film 13, first, the painted electrically conductive film is dried and photoresist is applied on the electrically conductive film. Then, the photoresist is dried and exposed through a photomask having a pattern corresponding to the pixel electrode PE, and the exposed photoresist is developed. Subsequently, the exposed electrically conductive film from the photo-resist is removed by an etching method, and the remaining photoresist is also removed. Thereby, the pixel electrode PE is formed by the above successive photoetching processes without using the vacuum film forming process. Moreover, when the electrically conductive film is formed of a photosensitive material including the electrically conductive material as other techniques, after applying the photosensitive film on substantially all over the surface of the third insulating film 13, the pixel electrode PE is formed by a series of processes of exposing and developing the photosensitive film through the photomask having the pattern corresponding to the pixel electrode PE. In addition, it is possible to directly form a patterned pixel electrode PE on the third insulating film 13 when the technique such as the ink-jet method for selectively applying the electrically conductive film. Moreover, in the formation process of the pixel electrode PE explained here, the first shield electrode SL1 and the second shield electrode SL2 can be formed simultaneously.

Then, the first alignment film AL1 covering the pixel electrode PE, etc., is formed (ST6). The first alignment film AL1 also covers the first shield electrode SL1 and the second shield electrode SL2. The array substrate AR is manufactured through the processes.

On the other hand, the counter substrate CT in which the common electrode CE is formed is manufactured. In addition, the common electrode CE may be formed through the process of painting the same electrically conductive film as the pixel electrode PE.

Then, the liquid crystal display panel LPN holding the liquid crystal layer LQ between the array substrate AR and the counter substrate CT is manufactured while the main common electrode CA of the common electrode CE counters with the source line S.

According to this embodiment, the pixel electrode PE can be formed by the process which does not need vacuum conditions. For this reason, it is possible to simplify the manufacturing process and to reduce manufacturing cost. The electrically conductive film is formed using one of materials selected from the group consisting of carbon nanotube, gold nanowire, silver nanowire, graphene, and conductive polymers (polyacetylene, polythiophene, etc.). For this reason, as compared with the case where both of the pixel electrode PE and the common electrode CE are formed of ITO or IZO, it becomes possible to reduce the used amount of indium (In). Moreover, the common electrode CE can be also formed by the same electrically conductive film as the above-mentioned pixel electrode PE. When both of the pixel electrode PE and the common electrode CE are formed of the above-mentioned electrically conductive film, it becomes possible to realize an indium free device. Moreover, the above-mentioned electrically conductive film which forms the pixel electrode PE is strong against stress as compared with ITO, IZO, etc. Accordingly, even if such strong stress so as to bend the substrate is applied, disconnection and peeling off of the pixel electrode PE are suppressed. Thereby, it also becomes possible to form the pixel electrode on a flexible substrate.

Moreover, in the process of manufacturing the pixel electrode PE, it is possible to form simultaneously the first shield electrode SL1 facing the gate line G and the second shield electrode SL2 facing the source line S. For this reason, it is possible to simplify the manufacturing process and to reduce manufacturing cost further. Moreover, it is possible to shield undesirable electric field from the gate line G by the first shield electrode SL1. In addition, it is possible to shield undesirable electric field from the source line S by the second shield electrode SL2. For this reason, it becomes possible to control alignment disorder of the liquid crystal molecule resulting from the undesired electric field impressed to the liquid crystal layer LQ, and to control degradation of display grace.

In addition, though some of the above-mentioned electrically conductive material films forming the pixel electrode PE may have comparatively high resistivity, since the pixel electrode PE is formed in a minute size in one pixel, influence due to increase of resistance is neglected. Moreover, since the first shield electrode SL1 and the second shield electrode SL2 are mutually connected and formed in the shape of a lattice surrounding each pixel, it becomes possible to suppress the increase of potential gradient resulting from increase of the resistance.

Moreover, although opaque materials may be also used as the above-mentioned electrically conductive material which forms the pixel electrode PE, overlapped region in which the pixel electrode PE overlaps with the aperture hardly influences to the display. That is, even at the time of ON, since the lateral electric field is hardly formed (or sufficient electric field to drive the liquid crystal molecule LM is not formed) on the pixel electrode PE, the liquid crystal molecule LM hardly moves from the initial alignment direction like at the time of OFF. For this reason, as mentioned-above, the backlight hardly penetrates and also hardly contributes to the display at the time of ON. Therefore, if the pixel electrode PE is formed of the opaque materials like this embodiment, it becomes possible to suppress reduction of the transmissivity at the time of ON, or reduction of the area of the aperture AP comparing with the case where the pixel electrode PE is formed of transparent electrically conductive material.

Moreover, in this embodiment, even if at least one of the pixel electrode PE and the common electrode CE is formed of the electrically conductive opaque material, the linearly polarized light which entered into the liquid crystal display panel LPN is substantially in parallel with or orthogonally crosses the extending direction of the edges of the pixel electrode PE and the common electrode CE. For this reason, polarization plane of the linearly polarized light which is reflected by the edge of the pixel electrode PE or the common electrode CE is hard to be disturbed, and the polarization plane at the time when the light passed the first polarization plate PL1 can be maintained. Therefore, since the linearly polarized light which penetrates the liquid crystal display panel LPN at the time of OFF is fully absorbed by the second polarization plate PL2, it becomes possible to suppress optical leak. That is, it becomes possible to fully reduce the transmissivity and to control fall of a contrast ratio in the case of the black display. Moreover, it is not necessary to extend the width of the black matrix BM for the measure against the optical leak in the circumference of the pixel electrode PE or the common electrode CE, and it becomes possible to suppress reduction of the area of the aperture AP and transmissivity at the time of ON. Therefore, it becomes possible to control degradation of display grace.

Moreover, since high transmissivity is obtained in the electrode gap between the pixel electrode PE and the common electrode CE according to this embodiment, it becomes possible to correspond by expanding the inter-electrode distance between the pixel electrode PE and the main common electrodes CA in order to make transmissivity of each pixel high enough. Moreover, in the product specifications in which the pixel pitch differs each other, the same effect as the above mentioned embodiment can be acquired by changing the inter-electrode distance and using a peak condition of the transmissivity distribution. That is, in the display mode according to this embodiment, it becomes possible to supply the display device having various pixel pitches by setting up inter-electrode distance between the main pixel electrode and main common electrode corresponding to the product specification from low resolution with a comparatively large pixel pitch to high resolution with a comparatively small pixel pitch without necessarily using microscopic processing. Therefore, it becomes possible to realize the demand for high transmissivity and high resolution easily.

Moreover, according to this embodiment, the transmissivity fully falls in the region which overlaps with the black matrix BM. This is because the leak of electric field does not occur outside of the pixel from the common electrode CE located above the source line S, and undesired lateral electric field is not produced between the adjoining pixels on the both sides of the black matrix BM. That is, it is because the liquid crystal molecule in the region which overlaps with the black matrix BM maintains the state of the initial alignment like at the OFF time (or the time of the black display). Therefore, even if it is a case where the colors of the color filter differ between the adjoining pixels, it becomes possible to control the generating of mixed colors, and also becomes possible to control the fall of color reproducibility and the contrast ratio.

Moreover, when an assembling shift occurs between the array substrate AR and the counter substrate CT, a difference may arises in distances between the respective common electrodes CE of the both sides and the pixel electrode PE. However, the alignment shift is produced in common to all the pixels PX, there is no difference in the electric field distribution between the pixels PX, and the influence to the display of the image is negligible. Even if the assembling shift arises between the array substrate AR and the counter substrate CT, it becomes possible to control the undesirable electric field leak to the adjoining pixels. For this reason, even if it is in a case where the color of the color filter differs between the adjoining pixels, it becomes possible to control generating of mixed colors, and also becomes possible to control the fall of color reproducibility and the contrast ratio.

In this embodiment, the main common electrodes CA counter with the source lines S, respectively. In the case where the main common electrodes CAL and CAR are arranged above the source lines S1 and S2, respectively, the aperture portion AP which contributes to the display can be expanded as compared with the case where the main common electrodes CAL and CAR are arranged on the pixel electrode PE side rather than above the source lines S1 and S2, and it becomes possible to improve the transmissivity of the pixel PX.

Moreover, it becomes possible to expand the distance between the pixel electrode PE and the main common electrode CA in the first direction X, by arranging the main common electrodes CAL and CAR above the source lines S1 and S2, respectively, and also becomes possible to form more horizontal electric field closer to the horizontal direction. For this reason, it also becomes possible to maintain the wide viewing angle which is one of advantages of the general IPS mode.

Moreover, according to this embodiment, it becomes possible to form a plurality of domains in each pixel. For this reason, the viewing angle can be optically compensated in a plurality of directions, and the wide viewing angle is attained.

Moreover, in the above embodiment, although the case where the liquid crystal layer LQ is constituted by the liquid crystal material which has positive (positive type) dielectric constant anisotropy is explained, the liquid crystal layer LQ may be constituted by liquid crystal material which has negative (negative type) dielectric constant anisotropy.

Next, a modification according to the first embodiment is explained.

Figure 6:
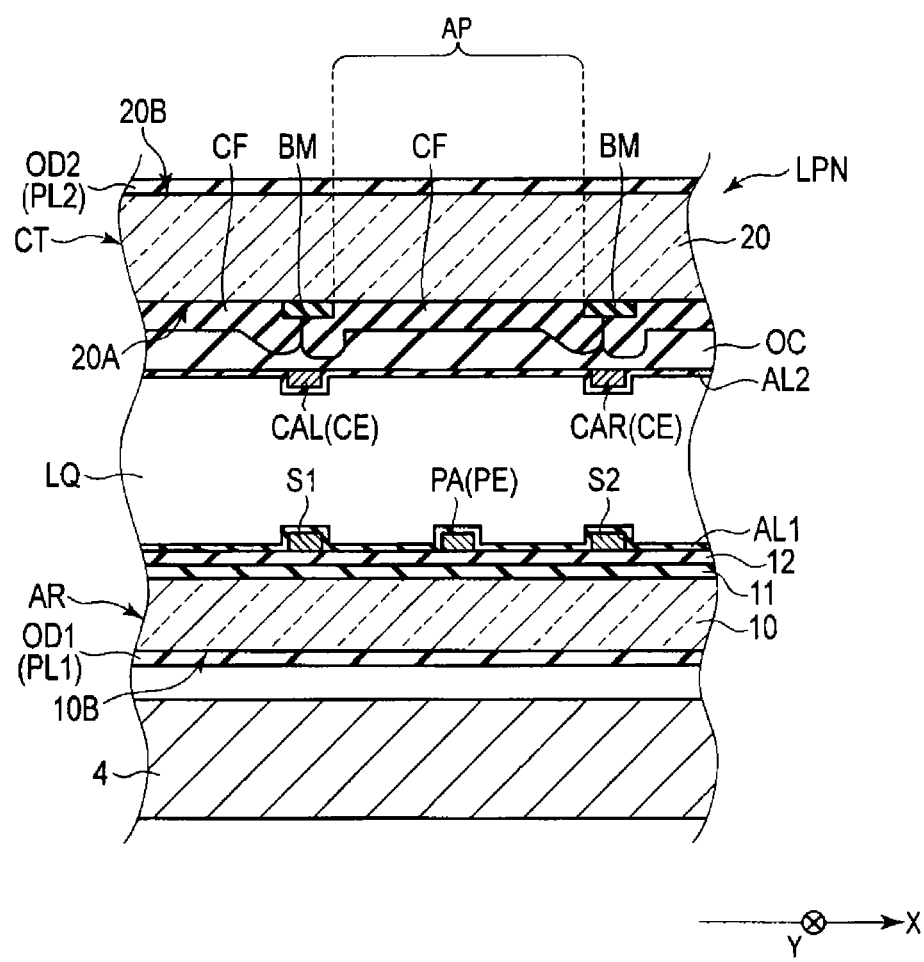
FIG. 6 is a cross-sectional view schematically showing the structure of the liquid crystal display panel taken along line in a first direction according to one modification of the first embodiment.
Figure 7:
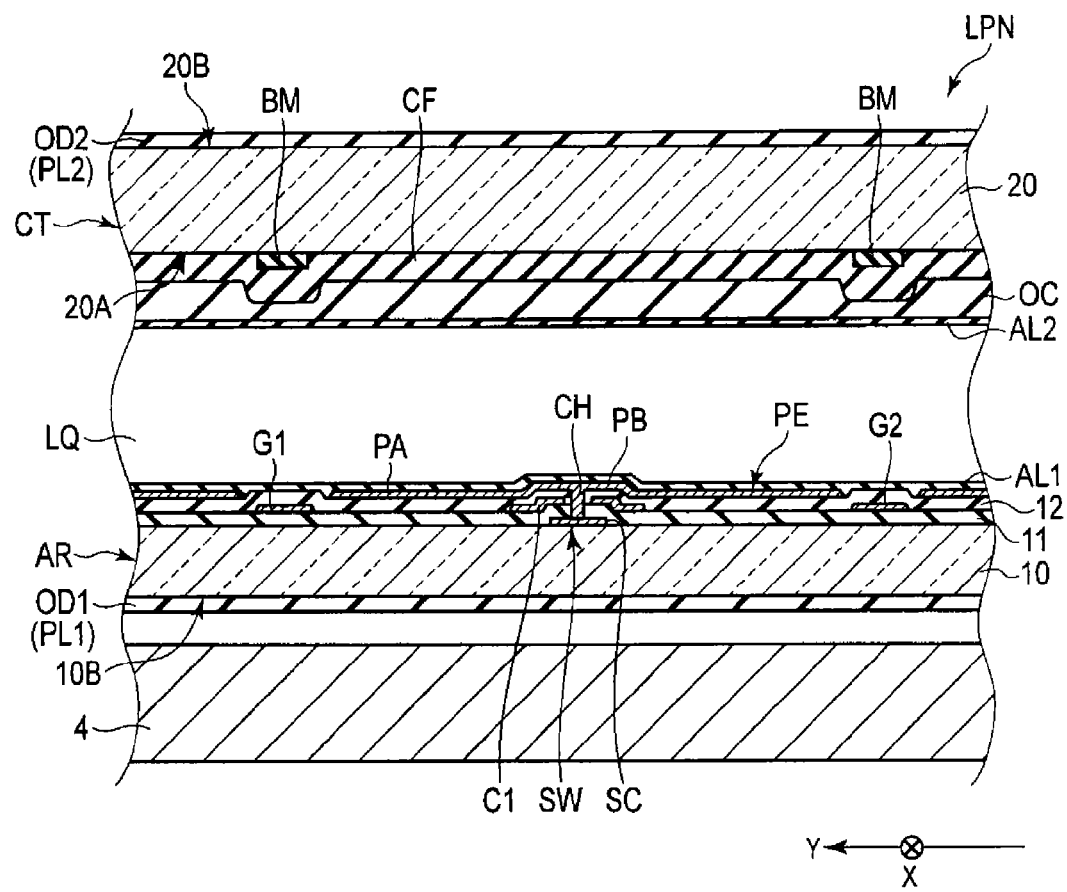
FIG. 7 is a cross-sectional view schematically showing the structure of the liquid crystal display panel taken along line in a second direction according to one modification of the first embodiment.

FIG. 6 is a cross-sectional view schematically showing the structure of the liquid crystal display panel taken along line in the first direction X according to one modification of the first embodiment. FIG. 7 is a cross-sectional view schematically showing the structure of the liquid crystal display panel taken along line in the second direction Y according to the modification of the first embodiment.

As compared with the first embodiment shown in FIG. 3 and FIG. 4, the modification is different in that the pixel electrode PE is formed in the same layer as the source lines S1 and S2, and that the third insulating film 13, the first shield electrode SL1 and the second shield electrode SL2 are omitted. In addition, the form of the pixel electrode PE is the same cross form as the example shown in FIG. 2A.

That is, the source line S1, the source line S2 and the pixel electrode PE are formed on the second insulating film 12 which covers the auxiliary capacitance line C1, the gate line G1, and the gate line G2. The pixel electrode PE is located between the source line S1 and the source line S2 apart from the source line S1 and the source line S2. The main pixel electrode PA extends along the second direction Y. The sub-pixel electrode PB extends along the first direction X and contacts the semiconductor layer SC through a comparatively shallow contact hole CH formed in the first insulating film 11 and the second insulating film 12, and is electrically connected with the switching element SW. The source line S1, the source line S2, and the pixel electrode PE are covered with the first alignment film AL1. Moreover, the first alignment film AL1 is arranged also on the second insulating film 12.

Figure 8:
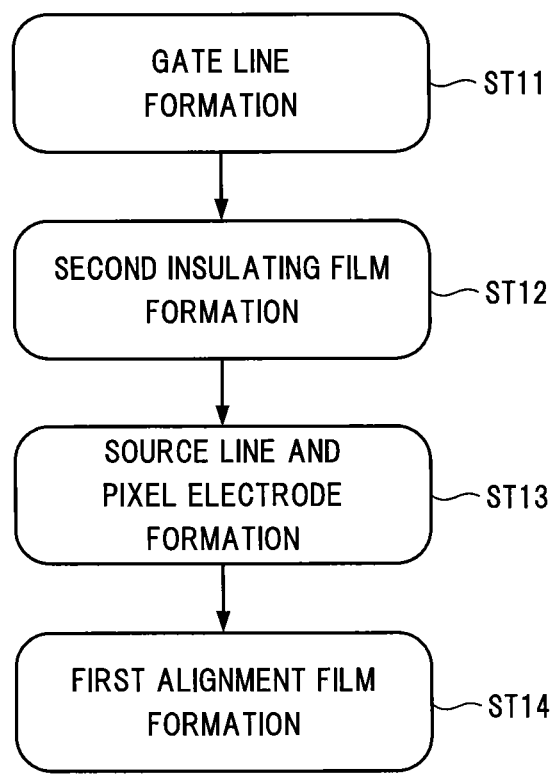
FIG. 8 is a flow-chart showing a process for manufacturing an array substrate shown in FIGS. 6 and 7.

FIG. 8 is a flow-chart showing the process for manufacturing an array substrate AR shown in FIGS. 6 and 7. Herein, only main processes are illustrated.

First, after forming the semiconductor layer SC and the first insulating film 11 on the first insulating substrate 10, the gate line G integrally formed with the gate electrode of the switching element SW and the auxiliary capacitance line C arranged apart from the gate line G are formed on the first insulating film 11 (ST11). Then, the second insulating film 12 which covers the gate line G, etc., is formed (ST12).

Then, the source line S integrally formed with the source electrode of the switching element SW and the pixel electrode PE connected with the switching element SW are formed on the second insulating film 12 (ST13). Here, the source line S and the pixel electrode PE are formed by painting and patterning the electrically conductive film like the embodiment shown in FIG. 5. The electrically conductive materials used here are the same materials as abovementioned. In particular, the electrically conductive materials that can be formed into the electrically conductive film by the film formation method other than the vacuum film formation method is chosen as the material suitable for the electrically conductive material.

Then, the first alignment film AL1 that covers the source line S, the pixel electrode PE, etc., are formed (ST14). The array substrate AR is manufactured through the above processes.

According to the above modification, the same effect as the first embodiment is acquired.

Moreover, the pixel electrode PE can be formed by the same material as the source line S formed in the same layer. For this reason, in the process of forming the source line S, the pixel electrode PE can be also formed simultaneously, and it becomes possible to skip the process of forming the pixel electrode PE, separately, as compared with the embodiment shown in FIG. 3. Moreover, in the modification shown here, it becomes possible to also skip the process of forming the third insulating film 13. Therefore, it becomes possible to reduce a manufacturing cost.

Moreover, the pixel electrode PE is electrically connected with the semiconductor layer SC of the switching element SW through a shallow contact hole CH as compared with the embodiment shown in FIG. 3. The diameter of the contact hole CH which penetrates the first insulating film 11 and the second insulating film 12 is smaller than the diameter of the contact hole formed in the third insulating film 13, and the influence which the unevenness of the contact hole CH gives to the alignment of the liquid crystal molecule LM is also small. For this reason, it becomes possible to control the optical leak at the time of OFF resulting from unevenness of the contact hole CH, and to improve a contrast ratio. Moreover, in order to shield the optical leak, it is not necessary to expand the width of the auxiliary capacitance line C1 in the second direction Y more than needed, and it becomes possible to control reduction of the area of the aperture AP.

Moreover, in the embodiment, the first alignment treatment direction PD1 of the first alignment film AL1 is in parallel to the direction of the long end of the pixel PX, i.e., the second direction Y in the approximately rectangular pixel PX. Therefore, in one pixel, a portion of the wirings, i.e., the gate line and the auxiliary capacitance line extending in the first direction X, and the short end of the pixel electrode PE cross the first alignment treatment direction PD1. That is, the first alignment direction PD1 intersects neither other wirings, for example, the source line extending in the second direction Y, nor the long end of the pixel electrode PE. Therefore, even if there were regions which were not fully carried out the alignment treatment due to the unevenness of the wirings and the electrodes, the regions in which the alignment treatment is not fully carried out is made small as compare with the case where the first alignment film AL1 is treated in the first direction X crossing the long end of the pixel PX. That is, the regions in which the alignment treatment is not fully carried out are generated along the short end of the pixel electrodes PE or the wirings which intersect the first alignment treatment direction PD1. Accordingly, it becomes possible to make small the region in which the alignment treatment is not fully carried out by making the length of the end of the pixel PX crossing the first alignment direction PD1 small.

In the embodiment, the structure of the pixel PX is not limited to the example shown in FIG. 2.

Figure 9:
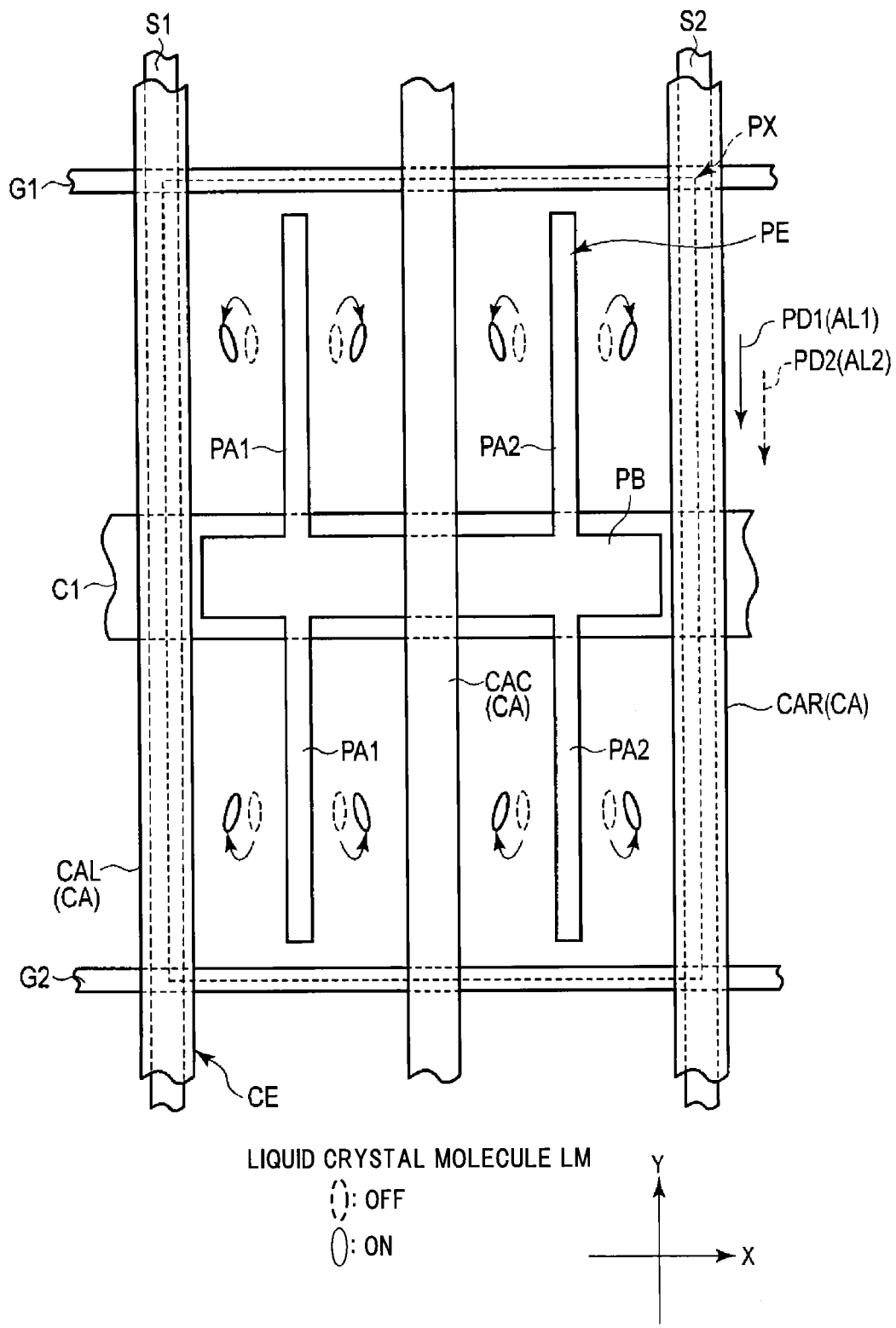
FIG. 9 is a plan view schematically showing a structure of one pixel when a display panel shown in FIG. 1 is seen from the counter substrate side according to a second embodiment.

FIG. 9 is a plan view schematically showing the structure of one pixel when a display panel shown in FIG. 1 is seen from the counter substrate side according to a second embodiment.

This second embodiment is different from the first embodiment in the following point. First, the pixel electrode PE includes a plurality of main pixel electrodes PA arranged in parallel along the first direction with an interval. Second, the common electrode CE includes a main common electrode CAC between the adjoining main pixel electrodes PA in addition to the main common electrode CAL of the left-hand side end, and the main common electrode CAR of the right-hand side end of the pixel PX. Here, the illustration of the first shield electrode SL1 and the second shield electrode SL2 are omitted.

That is, the pixel electrode PE is equipped with a main pixel electrode PA1, a main pixel electrode PA2, and a sub-pixel electrode PB. The main pixel electrode PA1 and the main pixel electrode PA2 linearly extends along the second direction Y, respectively, and are arranged in parallel in the first direction X with an interval therebetween. The sub-pixel electrode PB extends along the first direction X, and is located in an region which overlaps with the auxiliary capacitance line C1. The sub-pixel electrode PB is electrically connected with the switching element which is not illustrated.

The common electrode CE is equipped with the main common electrode CAL, the main common electrode CAR, and the main common electrode CAC. The main common electrodes CAL, the main common electrode CAR, and the main common electrode CAC linearly extend along the second direction Y, respectively, and are arranged substantially in parallel in the first direction X with an interval. The main common electrode CAL is located on the left-hand side of the main pixel electrode PA1, the main common electrode CAR is located on the right-hand side of the main pixel electrode PA2, and the main common electrode CAC is located between main pixel electrode PA1 and the main pixel electrode PA2.

Also in the above structure, the pixel electrode PE can be formed of the above electrically conductive film and the common electrode CE may be formed by the same electrically conductive film. Thereby, the same effect as the first embodiment is achieved.

Figure 10:
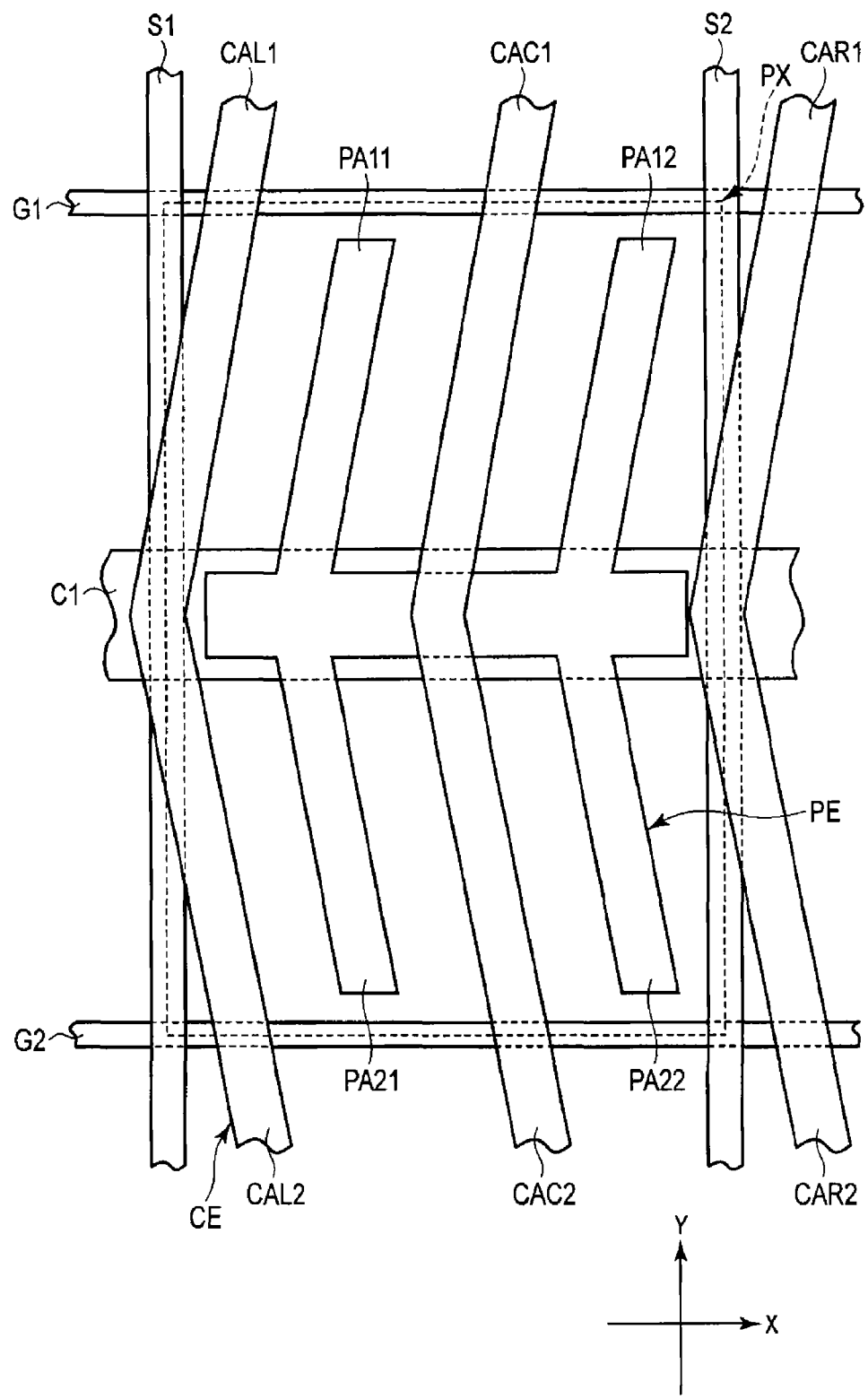
FIG. 10 is a plan view schematically showing a structure of one pixel when a display panel shown in FIG. 1 is seen from the counter substrate side according to a third embodiment.

FIG. 10 is a plan view schematically showing the structure of one pixel when a display panel shown in FIG. 1 is seen from the counter substrate side according to a third embodiment.

The third embodiment is different as compared with the second embodiment shown in FIG. 9 in that the pixel electrode PE and the common electrode CE are crooked to the second direction Y.

That is, the pixel electrode PE is equipped with a main pixel electrode PA11 and a main pixel electrode PA12 in the upper half portion of the pixel PX, and a main pixel electrode PA21 and a main pixel electrode PA22 in the bottom half portion of the pixel PX. The main pixel electrode PA11 and the main pixel electrode PA12 are arranged in parallel each other in the first direction X with an interval, and are inclined by 5° to 30° in a clockwise direction with respect to the second direction Y. The main pixel electrode PA21 and the main pixel electrode PA22 are arranged in parallel each other in the first direction X with an interval, and are inclined by 5° to 30° in a counterclockwise direction with respect to the second direction Y. The main pixel electrode PA11 and main pixel electrode PA21 are electrically connected mutually sandwiching the sub-pixel electrode PB, and the main pixel electrode PA12 and the main pixel electrode PA22 are similarly connected so as to sandwich the sub-pixel electrode PB.

The common electrode CE is equipped with a main common electrode CAL1, a main common electrode CAC1, and a main common electrode CAR1 in the upper half portion of the pixel PX, and a main common electrode CAL2, a main common electrode CAC2 and a main common electrode CAR2 in the bottom half portion of the pixel PX. The main common electrode CAL1, the main common electrode CAC1 and the main common electrode CAR1 are arranged in parallel each other in the first direction X with an interval, and extends substantially in parallel with the main pixel electrode PA11 and the main pixel electrode PA12. The main common electrode CAL2, the main common electrode CAC2, and main common electrode CAR2 are arranged in the first direction X with an interval, and extends in parallel with the main pixel electrode PA21 and the main pixel electrode PA22. The main common electrode CAL1 is electrically connected with the main common electrode CAL2, the main common electrode CAC1 is electrically connected with the main common electrode CAC2, and the main common electrode CAR1 is electrically connected with the main common electrode CAR2.

Also in the above structure, the pixel electrode PE may be formed of the above electrically conductive film, and the common electrode CE may be formed of the similar electrically conductive film. Thereby, the same effect as the first embodiment is achieved.

As explained above, according to the embodiments, while reduction of a manufacturing cost is possible, it becomes possible to supply the liquid crystal display device and the manufacturing method thereof which can control degradation of display grace.

While certain embodiments have been described, these embodiments have been presented by way of embodiment only, and are not intended to limit the scope of the inventions. In practice, the structural elements can be modified without departing from the spirit of the invention. Various embodiments can be made by properly combining the structural elements disclosed in the embodiments. For embodiment, some structural elements may be omitted from all the structural elements disclosed in the embodiments. Furthermore, the structural elements in different embodiments may properly be combined. The accompanying claims and their equivalents are intended to cover such forms or modifications as would fall within the scope and spirit of the inventions.

What is claimed is:

1. A liquid crystal display device, comprising:
    a first substrate including:
        a first wiring extending in a first direction,
        a third wiring extending in the first direction at a distance from the first wiring,
        a first insulating film covering the first wiring and the third wiring,
        a second wiring formed on the first insulating film and extending in a second direction orthogonally crossing the first direction,
        a switching element electrically connected with the first and second wirings,
        a second insulating film covering the second wiring and the switching element,
        a pixel electrode formed on the second insulating film and electrically connected with the switching element via a contact hole penetrating through the first insulating film and the second insulating film,
        a first shield electrode formed on the second insulating film apart from the pixel electrode and facing the first wiring,
        a second shield electrode formed on the second insulating film apart from the pixel electrode and facing the second wiring, and
        a first alignment film covering the pixel electrode and the first and second shield electrodes,
    a second substrate including a main common electrode facing the second wiring and extending in the second direction, and a second alignment film covering the main common electrode; and
    a liquid crystal layer held between the first substrate and the second substrate containing liquid crystal molecules;
    wherein the pixel electrode comprises a sub-pixel electrode above and overlapping with the third wiring,
    the contact hole overlaps with the sub-pixel electrode,
    the pixel electrode and the first and second shield electrodes are formed of one of materials selected from the group consisting of carbon nanotube, gold nanowire, silver nanowire, graphene, and conductive polymers,
    the switching element comprises a semiconductor layer and a drain electrode, the contact hole comprises a first contact hole penetrating the first insulating film and a second contact hole penetrating the second insulating film, the semiconductor layer extends below the third wiring and the second wiring, and the drain electrode contacts the semiconductor layer via the first contact hole and contacts the sub-pixel electrode via the second contact hole, and
    the second contact hole overlaps with the first contact hole.

2. The liquid crystal display device according to claim 1, wherein a width of the sub-pixel electrode in the second direction is smaller than a width of the third wiring in the second direction.

3. The liquid crystal display device according to claim 1, wherein the pixel electrode comprises a main pixel electrode extending in the second direction, the sub-pixel electrode and the main pixel electrode cross each other in a cross shape, and the main pixel electrode does not overlap with the main common electrode.

4. The liquid crystal display device according to claim 1, wherein the first substrate further comprises a fourth wiring extending in the first direction and crossing the second wiring, and the third wiring is located substantially in a middle between the first wiring and the fourth wiring.

* * * * *